United States Patent [19]
Sakai et al.

[11] Patent Number: 5,606,243
[45] Date of Patent: Feb. 25, 1997

[54] BATTERY STATE JUDGING APPARATUS

[75] Inventors: Shoji Sakai, Toyota; Hironori Asa; Mitsuo Inagaki, both of Okazaki, all of Japan

[73] Assignee: Nippon Soken, Inc., Aichi-ken, Japan

[21] Appl. No.: 341,114

[22] Filed: Nov. 18, 1994

[30]     Foreign Application Priority Data

Nov. 19, 1993  [JP]  Japan ................................. 5-290598
Mar. 25, 1994  [JP]  Japan ................................. 6-079385

[51] Int. Cl.$^6$ ........................................................... G01R 31/36
[52] U.S. Cl. ........................................................ 320/48; 320/2
[58] Field of Search ............................... 320/2, 43, 44, 320/48

[56]            References Cited

U.S. PATENT DOCUMENTS

| | | | |
|---|---|---|---|
| 5,321,627 | 6/1994 | Reher | 364/483 |
| 5,325,041 | 7/1994 | Briggs | 320/44 |
| 5,349,535 | 9/1994 | Gupta | 364/483 |
| 5,352,982 | 10/1994 | Nakazawa et al. | 324/427 |
| 5,394,089 | 2/1995 | Clegg | 324/427 |
| 5,479,085 | 12/1995 | Honda et al. | 320/48 |
| 5,487,002 | 1/1996 | Diller et al. | 364/424.01 |

FOREIGN PATENT DOCUMENTS 2187679  7/1990  Japan .
4368401  12/1992  Japan .

*Primary Examiner*—Robert Nappi
*Attorney, Agent, or Firm*—Cushman Darby & Cushman, IP Group of Pillsbury Madison & Sutro LLP

[57]            ABSTRACT

A battery state judging apparatus comprising a voltage detector detecting a voltage at a terminal of a battery, a current detector detecting a charge/discharge current of the battery and an arithmetic operation circuit calculating a residual capacity index of the battery relating to a value obtained by subtracting a quantity of electric charge from a reference capacity value of the battery and calculating a power consumption of the battery from the detected terminal voltage and charge/discharge current. The arithmetic operation circuit estimates a charge/discharge current as a function of the battery residual capacity index and battery power consumption and successively estimates a charge/discharge current in a predetermined power consumption pattern to successively calculate a battery residual capacity index from the estimated charge/discharge current. A battery operable threshold is judged when a battery discharge current, estimated on the basis of an updated battery residual capacity index exceeds a threshold current at that power consumption, and a result is displayed via a display circuit.

6 Claims, 15 Drawing Sheets

$$Kt = 1-e^{-\frac{t}{Tk}} \quad [Tk=1800]$$

332w

837w

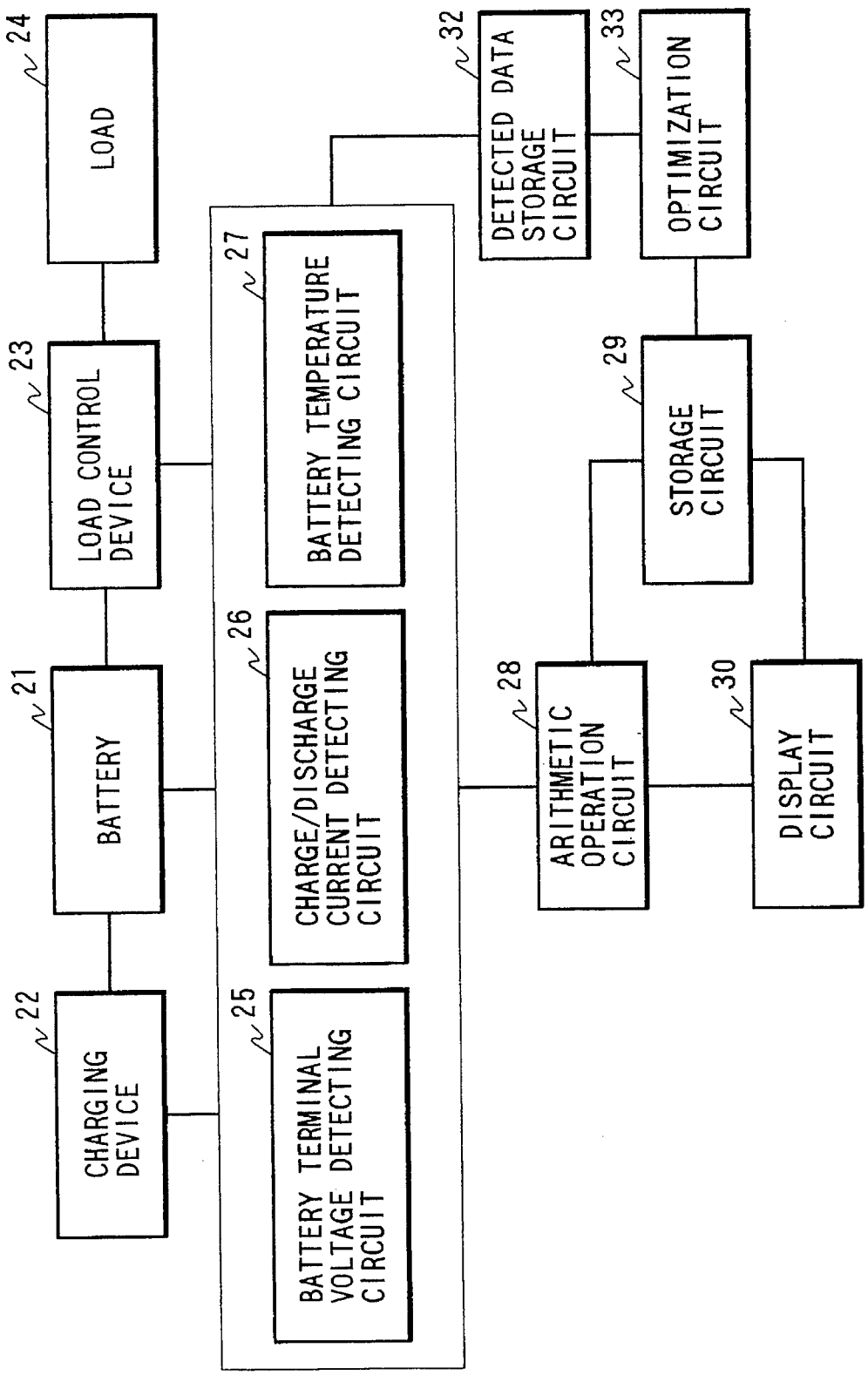

BATTERY STATE JUDGING APPARATUS

BACKGROUND OF THE INVENTION

1. Field the Invention

The present invention relates to a judging apparatus that judges an amount of charge in a battery. More specifically, the present invention relates to a judging apparatus which detects a charged state of a battery of an electric automobile by formulating a characteristic (that is, a relation among an electric energy, a residual capacity and a current) of a battery to estimate a residual capacity of the battery so that it is possible to estimate an available time for which the automobile will be able to run off of the battery, and it is further possible to notify a driver of the automobile of the need to recharge the battery.

2. Description of the Related Art

A residual operating time of a battery is not determined merely by a difference between a rated capacity and a quantity of electric charge or discharge to or from the battery, but is largely affected by the temperature of the battery, the magnitude of a discharged current, and a downtime between charging or discharging of the battery. For these reasons, it has been difficult to accurately estimate a residual operating time of a battery. To solve this problem, Japanese Patent Application Laid-Open Publication No. 2-187679 teaches a technique to store a relation among a temperature, a charged or discharged current, a voltage (or an internal resistance of a battery) and a residual operating time of the battery in a ROM.

A charge state of a battery can be estimated by subtracting an integrated value of a discharged current, that is, a quantity of electric charge, from a full charge capacity. This technique estimates a relatively accurate residual capacity of a battery when the discharge is at a constant current. This technique, however, cannot provide an accurate residual capacity of a battery if the consumed current of the battery fluctuates greatly according to a running state of a vehicle, for example, an electric automobile.

There is disclosed in Japanese Patent Application Laid-Open Publication No. 4-368401 an apparatus that calculates an operating rate of a battery from a temperature of the battery and a discharged current to estimate a current residual capacity of the battery from a previously detected residual capacity, an operating rate from the previously detected residual capacity and a current discharged between the previous detection time and the current detection time.

The technique disclosed in Japanese Patent Application Laid-Open Publication No. 2-187679 has a disadvantage in that the volume of data to be stored in a ROM is enormous because a relation among a charge or discharge current, a voltage and a temperature of a battery for every pattern of various running conditions of a vehicle need to be stored.

On the other hand, the apparatus disclosed in Japanese Patent Application Laid-Open Publication No. 4-368401 has a disadvantage in that it is impossible to accurately estimate a threshold at which the battery requires a recharge because actual batteries used to drive vehicles have variations in characteristics, or the previously detected residual capacity may change due to a number of factors, such as deterioration during use of the battery.

SUMMARY OF THE INVENTION

To overcome the above disadvantages, an object of the present invention is to provide a battery state judging apparatus in which a characteristic of the battery is formulated in order to decrease the amount of data to be stored in a ROM.

Another object of this invention is to provide a battery state judging apparatus which can accurately estimate an operable threshold of a battery without being affected by variations in a reference capacity of the battery, deterioration of the battery over time, fluctuations in discharged current and the like.

According to a first embodiment of the present invention, there is provided a battery state judging apparatus comprising a voltage detecting means detecting a voltage at a terminal of the battery, a current detecting means detecting a charged and discharged current of the battery, a residual capacity index calculating means calculating a residual capacity index of the battery relating to a value obtained by subtracting a quantity of electric charge or discharge from a reference capacity value of said battery, a power consumption calculating means calculating a power consumption of said battery from said terminal voltage and the charge or discharge current, and a charge/discharge current estimating means estimating a charge or discharge current of the battery as a function of the battery residual capacity index and the battery power consumption.

In the above battery state judging apparatus, a terminal voltage and an output current of the battery are detected to calculate an independent variable in a battery characteristic equation on the basis of these detected values. A charge or discharge current is estimated from the battery characteristic equation whose independent variable is calculated and the output current of the battery to judge a state of the battery from the estimated charge or discharge current.

The above battery state judging apparatus may additionally include a judging means giving a predetermined power consumption pattern to the charge/discharge current estimating means to successively estimate a charge or discharge current, giving the charge or discharge current to the first residual capacity index calculating means to successively calculate a battery residual capacity index to judge a battery operable threshold when a battery discharged current estimated on the basis of an updated battery residual capacity index exceeds a threshold current under a power consumption at this time.

In the above configuration, the charge/discharge current estimating means estimates a battery charge or discharge current as a function of the battery residual capacity index and the battery power consumption. The battery operable threshold is determined when the battery discharge current in a predetermined power consumption pattern exceeds a threshold current at that power consumption so that the battery operable threshold may be accurately determined even if the discharge current largely fluctuates or deterioration with time occurs in the battery.

The above battery state judging apparatus may still further include a coefficient correcting means correcting coefficients in an estimation equation in the charge/discharge current estimating means so that an evaluation relating to a difference between a charge or discharge current estimated by the charge/discharge current estimating the means and a charge or discharge current detected by the current detecting means is a maximum or a minimum.

In the above configuration, in order to maximize or minimize an evaluation function relating to the charge or discharge current estimated by the charge/discharge current estimating means and the charge or discharge current detected by the current detecting means, the coefficient correcting means corrects the coefficients in the estimation equation in the charge/discharge current estimating means, so that the battery operable threshold is accurately known from the battery residual capacity index at that time calculated by the residual capacity index calculating means.

The above battery state judging state judging apparatus may still further include a distance detecting means detecting a distance of a trip of a vehicle within a predetermined period going back from the present time, a storage means storing a power consumption pattern during the predetermined period, and an available distance calculating means calculating a distance for which the vehicle will be able to run on the basis of a period until the battery operable threshold is reached based on the stored power consumption pattern, and a display means displaying an available distance calculated by the available distance calculating means. With the above configuration, it is possible to readily know an available distance for which the vehicle will be able to run based on the energy currently remaining in the battery.

The above battery state judging apparatus may still further include a residual capacity index correcting means correcting a battery residual capacity index calculated by the residual capacity calculating means on the basis of a correction quantity that is in proportion with a difference between a discharge current estimated by the charge/discharge current estimating means and a discharge current detected by said current detecting means.

In the above configuration, the battery residual capacity index calculated by the residual capacity index calculating means is corrected on the basis of a correction quantity that is in proportion with a difference between the discharge current estimated by the charge/discharge current estimating means and a discharge current detected by the current detecting means. When a value obtained by adding the correction quantity to the battery reference capacity value falls below a predetermined rate to the battery reference capacity value, the battery operable threshold is detected, thereby the battery operable threshold may be accurately judged even if the charge current fluctuates largely or deterioration with time occurs in the battery.

According to a second embodiment of the invention, there is provided a battery state judging apparatus comprising a voltage detecting means detecting a voltage at a terminal of a battery, a current detecting means detecting a charge or discharge current of the battery, a residual capacity index calculating means calculating a residual capacity index of the battery relating to a value obtained by subtracting a quantity of electric charge or discharge from a reference capacity value of the battery, a power consumption calculating means calculating a power consumption of the battery from the terminal voltage and the charge or discharge current, a charge/discharge current estimating means estimating a charge or discharge current of the battery as a function of the battery residual capacity index and the battery power consumption, a residual capacity index correcting means correcting a battery residual capacity index calculated by the residual capacity index calculating means on the basis of a correction quantity that is in proportion with a difference between a discharge current estimated by the charge/discharge current estimating means and a discharge current detected by said current detecting means, and a judging means judging a battery operable threshold when a value, which is obtained by adding the correction quantity obtained by the residual capacity index correcting means to sale reference capacity value of the battery, falls below a predetermined rate to the battery reference capacity value.

It is possible to additionally provide in the above battery state judging apparatus a temperature detecting means detecting a temperature of the battery, and a correcting means correcting the battery reference capacity value in the residual capacity index calculating mans on the basis of a temperature of the battery detected by the temperature detecting means.

In the above battery state judging apparatus, the residual index calculating means sets a weight corresponding to a value of a discharge current to the discharge current used to calculate a quantity of electric discharge.

It is possible to additionally provide to the above battery state judging apparatus a charge or discharge downtime correcting means correcting a battery residual capacity index calculated by the residual capacity index calculating means on the basis of a battery capacity recovery value during a charge or discharge downtime of the battery.

It is possible to still additionally provide in the above battery state judging apparatus a data storage means storing data of a battery charge or discharge current, a temperature of the battery and a voltage of the battery, and an optimization means optimizing the estimation equation in the charge/discharge current estimating means on the basis of the data stored in the data storage means after a trip by the vehicle.

With the above configuration, the battery operable threshold may be more accurately judged by virtue of the various corrections and optimizations.

In the battery state judging apparatus of this invention, the function in the charge/discharge current estimating means represented as follows:

$$\text{(charge/discharge current)}=\text{(power consumption)}\times[A\times\text{(residual capacity index)}^{K_1}+B\times\text{(residual capacity index)}^{K_2}C\times\text{(power consumption)}^{K_B}+D]$$

where:

A, B, C and D are coefficients; and

K1, K2 and K3 are constants.

According to the battery state judging apparatus of this invention, it is possible to accurately determine the battery operable threshold at any time even if there are variations in the battery reference capacity, deterioration of the battery over time, or fluctuations in the discharge current.

According to this invention, an independent variable in the battery characteristic equation is determined on the basis of a voltage, current and temperature of the battery during running or stopping of the vehicle to estimate an available period for which the vehicle will be able to run, thereby warning the operator to avoid a situation where the vehicle cannot run any farther because the energy in the battery is depleted.

According to this invention, there is no need to store running patterns of the vehicle based on a charge or discharge current, voltage and temperature of the battery, respectively, thereby reducing data to be stored in the storage means, enabling an employment of a ROM having a smaller storage capacity.

BRIEF DESCRIPTION OF THE DRAWINGS

FIG. 16 is a battery state judging apparatus according to a fourth embodiment of this invention.

DESCRIPTION OF PREFERRED EMBODIMENTS (Embodiment 1)

Now, a description of a first embodiment of this invention is provided below with reference to the accompanying drawings.

Figure 1:
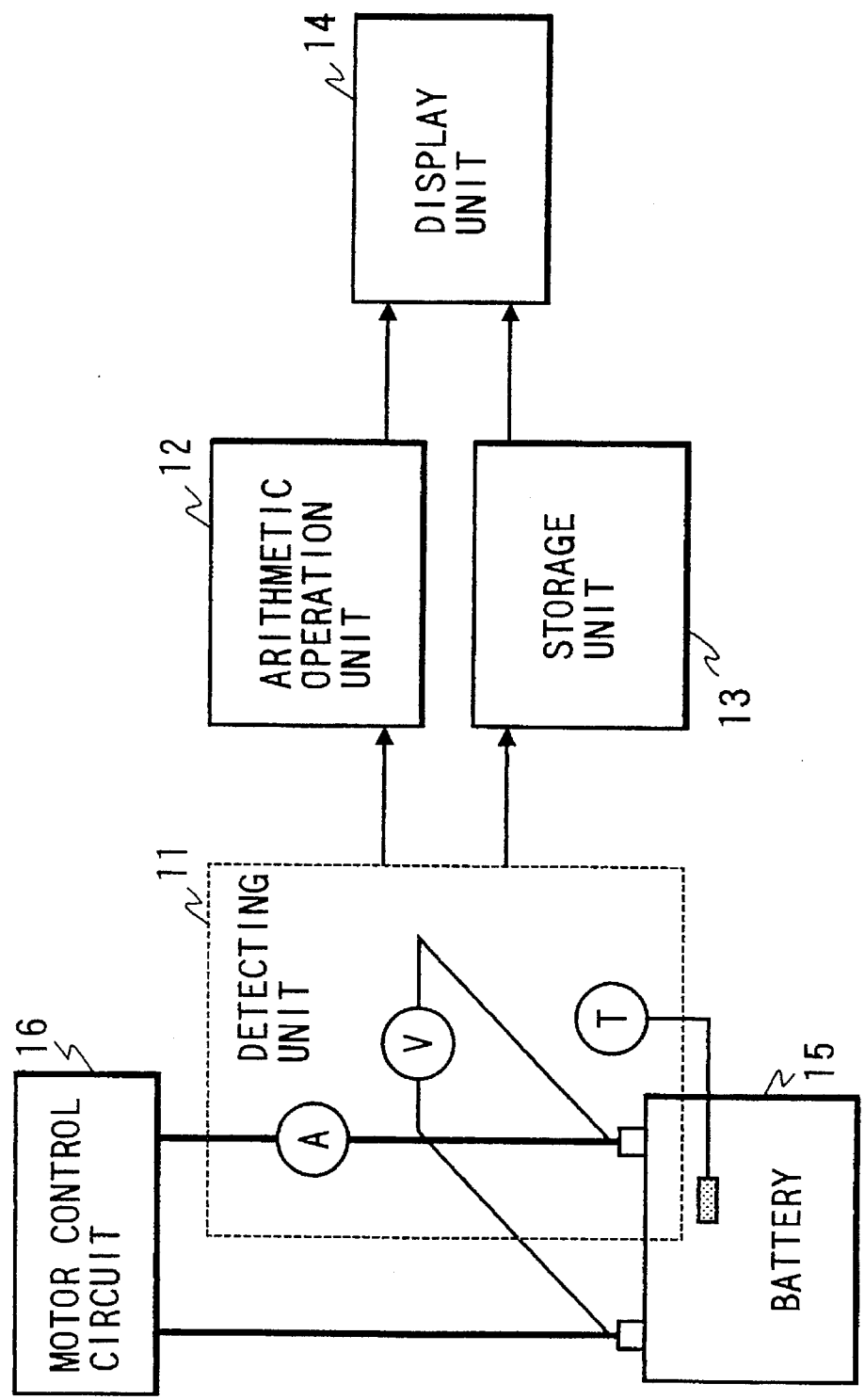
FIG. 1 is a block diagram of a battery state judging apparatus according to a first embodiment of this invention.

Referring now to FIG. 1, a battery state judging apparatus according to the first embodiment comprises a battery 15, a motor control unit 16 controlling an operation of a motor of a vehicle, a detecting unit 11 including a voltage detector detecting a voltage at a terminal of the battery, a current detector detecting a current of the battery and a temperature detector detecting a temperature of the battery, a storage unit 13 storing a relation between an available period for which a vehicle will be able to run under the energy available in the battery and a quantity of power consumption in various running patterns of the vehicle, an arithmetic operation unit 12 including a calculator calculating an independent variable of a characteristic equation of the battery prepared in advance and an estimating unit estimating a consumed current on the basis of a result of the characteristic expression of the battery calculated by the calculator and an output current detected by the current detector, and a displaying unit 14 including an operating device calculating an available period for which the vehicle will be able to continue to run on the basis of a consumed current estimated by the estimating unit and a running pattern of the vehicle stored in the storage unit, and a display means displaying the available period calculated by the operating device.

In the battery state judging apparatus shown in FIG. 1, the detecting unit 11 detects a voltage at the battery terminals, an output current and a temperature of the battery 15. The arithmetic operation unit 12 calculates an independent variable of the characteristic equation of the battery on the basis of the detected values detected by the detecting unit 11. The arithmetic operation of unit 12 then estimates a consumed current through the characteristic equation whose independent variable is thus calculated and the detected output current to calculate an available period for which the vehicle will be able to continue to run on the basis of the pattern stored in the storage unit 13. The available period is displayed on the displaying unit 14.

Next, the manner in which an equation representing a characteristic of the battery according to this invention is derived will be described.

The residual capacity of a battery that can be taken out from the battery differs depending on a magnitude of a discharged current or a temperature of a casing of the battery. To cope with such characteristics of the battery, a dischargeable capacity of the battery was measured under a condition where either a discharged current or a temperature of the battery was fixed.

Figure 2A:
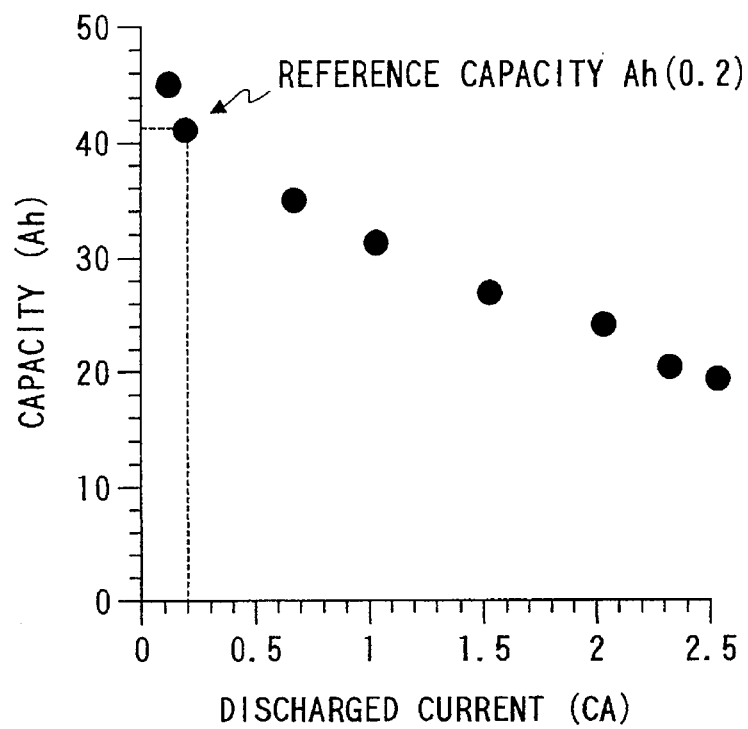
FIG. 2A is a graph showing the results of a constant-current discharging experiment.
Figure 2B:
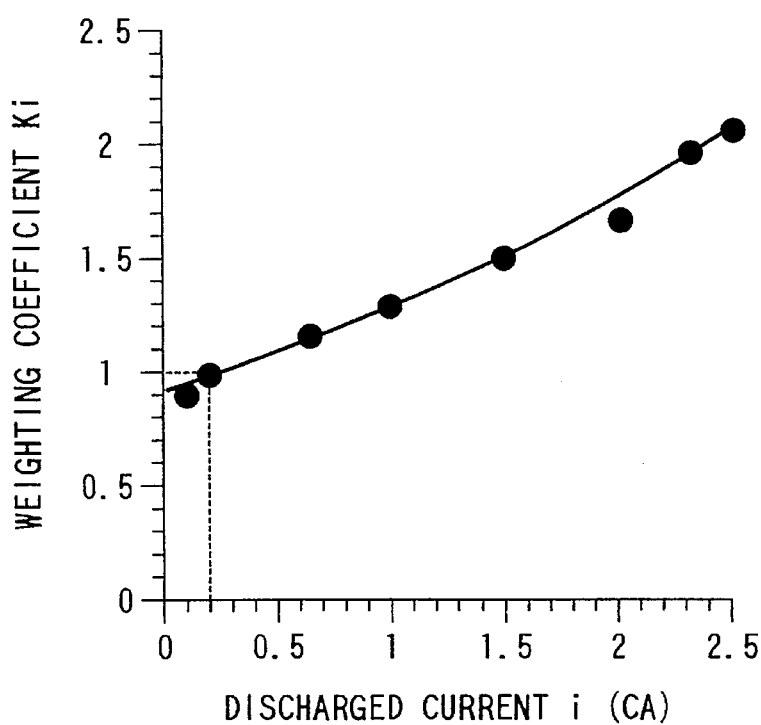
FIG. 2B is a graph showing a weighting coefficient for various discharge currents in FIG. 2A.

First, measurement was made on a dischargeable capacity for each discharged current of the battery where the casing of the battery was maintained at a temperature 30° C. (constant). A result of this measurement is shown in FIG. 2A. From the result shown in FIG. 2A, weighting coefficients Ki at various discharged current were determined on the basis of a coefficient Ki=1 at 0.2 [CA] of the discharged current i, as a reference. A result of this measurement is shown in FIG. 2B.

Figure 3:
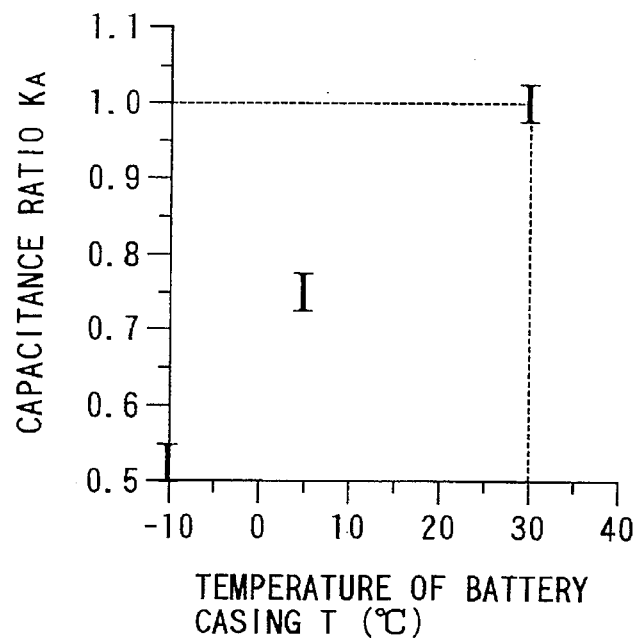
FIG. 3 is a graph showing the capacitance ratio corresponding to various temperatures of a casing of a battery on the basis of 0.2 CA discharge at 30° C. as a reference.

Next, an experiment of discharge at various temperatures of the casing under a condition of a constant power was made to determine capacity ratios KA at the respective temperature on the basis of a discharge capacity of 1 at a temperature of 30° C. Results of this experiment is shown in FIG. 3.

With use of the above weighting coefficient Ki and capacity ratio KA, an independent variable SOC (that is, a reduced residual capacity at 0.2 [CA]) of the battery characteristic equation is expressed as follows:

$$SOC = \frac{Ah(0.2) \cdot KA - Ki \cdot idt}{Ah(0.2)} \times 100(\%) \qquad (1)$$

where Ah(0.2) is a discharge reduced residual capacity at a temperature of 30° C. and a discharged current of 0.2 [CA].

Knowing that an electrolyte of the battery can reach uniformity within about 2 hours after ceasing the discharge, a fact that the SOC recovers to SOC0, where the electrolyte of the battery is in an uniform state in relation with a discharge downtime t, was derived, as shown in the following equation:

$$SOC = SOC + Kt(SOC0 - SOC) \qquad (2)$$

$$Kt = 1 - e^{-t/TK} \qquad (3)$$

$$SOC0 = \frac{Ah(0.2) \cdot KA - idt}{Ah(0.2)} \times 100(\%) \qquad (4)$$

Figure 4:
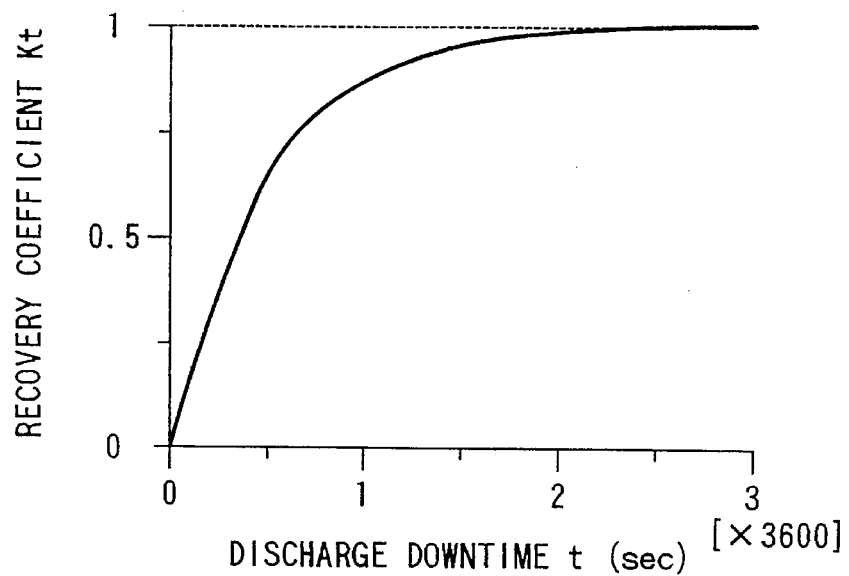
FIG. 4 is a graph showing the recovery of a battery electrolyte.

A relation between the discharge downtime t (sec) and the recovery coefficient Kt in the case of Tk=1800 is shown in FIG. 4.

Next, a constant power discharge experiment at a battery temperature of 30° C. was conducted to obtain data about an SOC, power and current. A equation of the relationship of these three variables, that is, the battery characteristic equation, was determined by a model method. A fundamental equation required in the model method is given as follows, taking the results of the constant power discharge experiment into account:

$$\text{(estimated current)} = Wa(A \cdot So^{Ki} + B \cdot So + C \cdot Wa + D) \quad (5)$$

where:
Wa is a discharged current/10;
So=1−SOC/100;
A, B, and D are coefficients;
Ki is a a multiplier; and
D is a constant.

From the above equation (5), it is possible to estimate a consumed current (an estimated current).

In order to increase the accuracy of an estimated current, it is indispensable to re-select the fundamental equation.

To optimize the coefficients A, B, and C, the constant 3 and the multiplier Ki in the fundamental equation, an optimal square method and a conjugate gradient method are employed. An evaluation function J is a root-mean-square of a difference between a measured current value and an estimated current value (FIG. 5).

Figure 5:
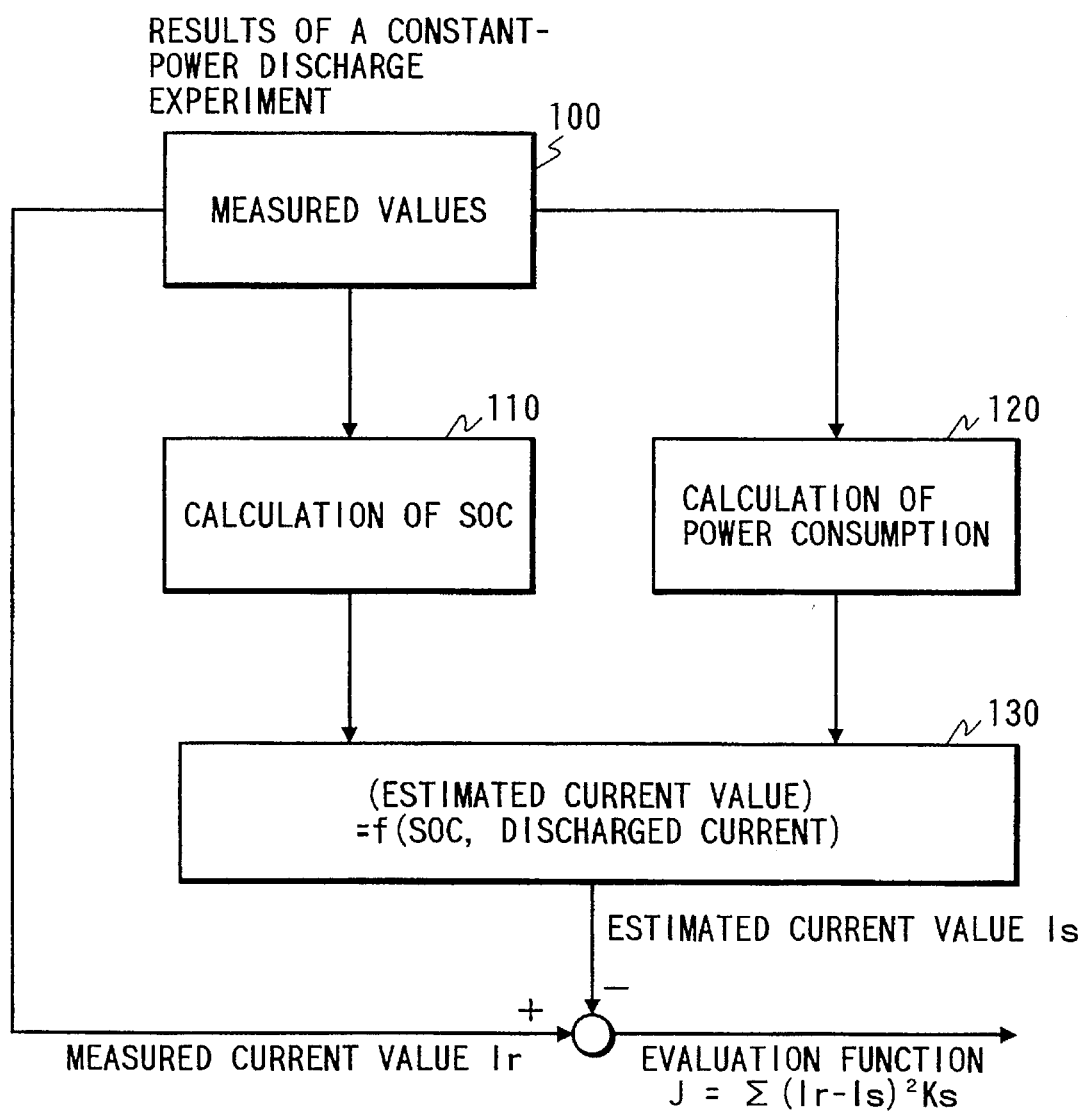
FIG. 5 is a flowchart of a process to optimize a battery characteristic equation using a modeling method.

As shown in FIG. 5, detecting unit 11 obtains data about a current, voltage, temperature, of battery 15 etc. at step 100. At step 110, an SOC is calculated according to equation (1). At step 120, power consumption is calculated. At step 130, an estimated current value is calculated according to equation (5). From the estimated current value and the actually measured current value, optimization of the coefficient A, B, and C, the constant D and the multiplier ii is carried out so as to minimize the evaluation function J.

In the case of charging the battery, coefficients in the fundamental equation of the characteristic equation of ;he battery are optimized in the similar manner.

Figure 6A:
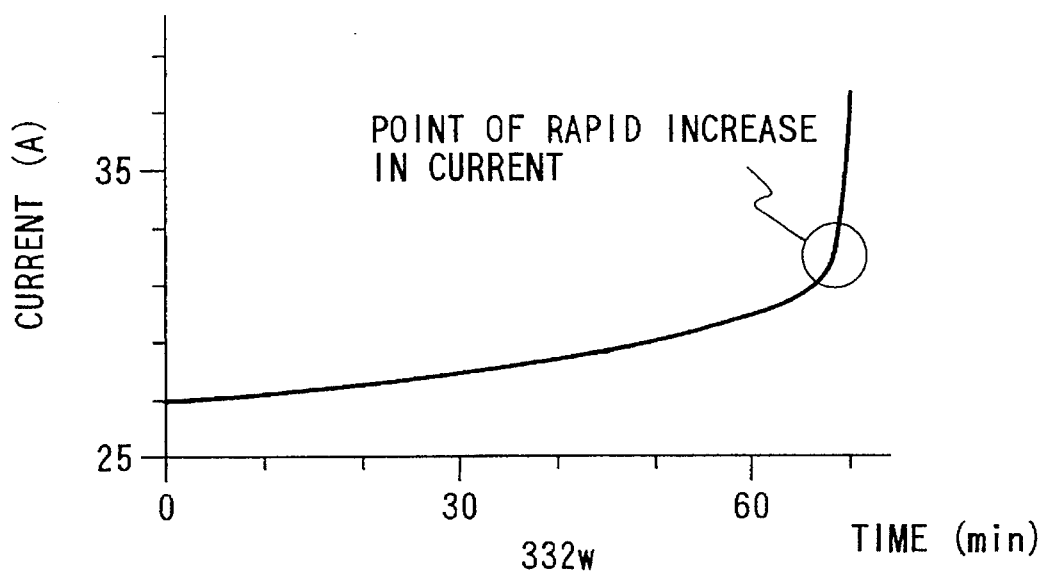
FIG. 6A is a graph showing current values measured in a discharging experiment at 332 W.
Figure 6B:
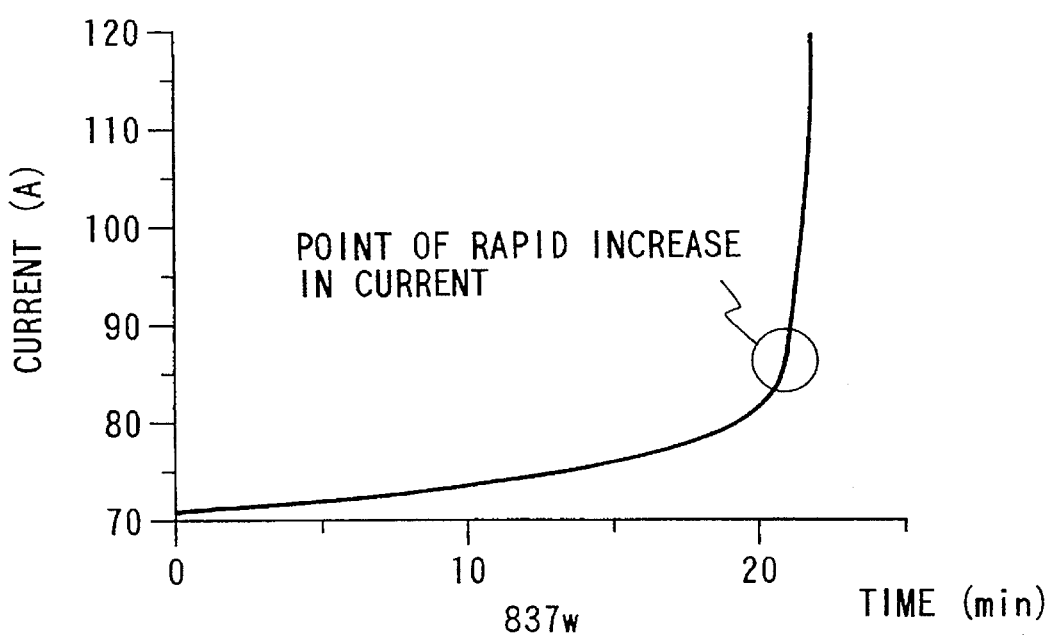
FIG. 6B is a graph showing current values measured in a discharging experiment at 837 W.
Figure 7:
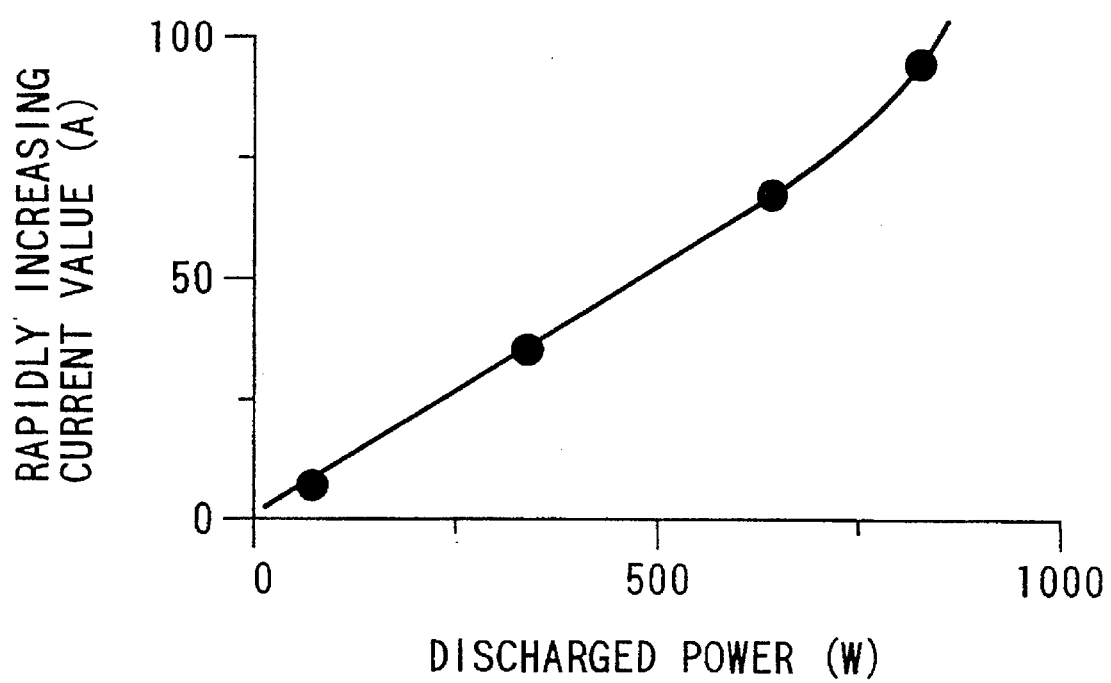
FIG. 7 is a graph showing a relation between a current value at which the current value rapidly increases in a constant power discharge and a discharged power.

As shown in FIGS. 6A and 6B, it was known from a constant-power discharging experiment that a current rapidly increases at the end of the discharge. FIG. 7 shows a elation between the discharged power and a threshold current value Ir (that is, a rapidly increasing current value) at which the rapid increase begins. Use of the battery in the vicinity of the threshold current value should be avoided in order to reduce maintenance of the electrode plates.

According to this embodiment, a value of a current flowing during running of the vehicle under the present condition or current flowing when the running pattern of the discharged power (at time intervals of at) stored in advance is repeated is estimated from the battery characteristic equation. If the estimated current value relative to the discharged power exceeds the threshold current value Ir, it is judged that running under the present condition is unattainable so that an available period for which the vehicle will be able to run is determined on the basis of the threshold current value Ir.

Figure 8:
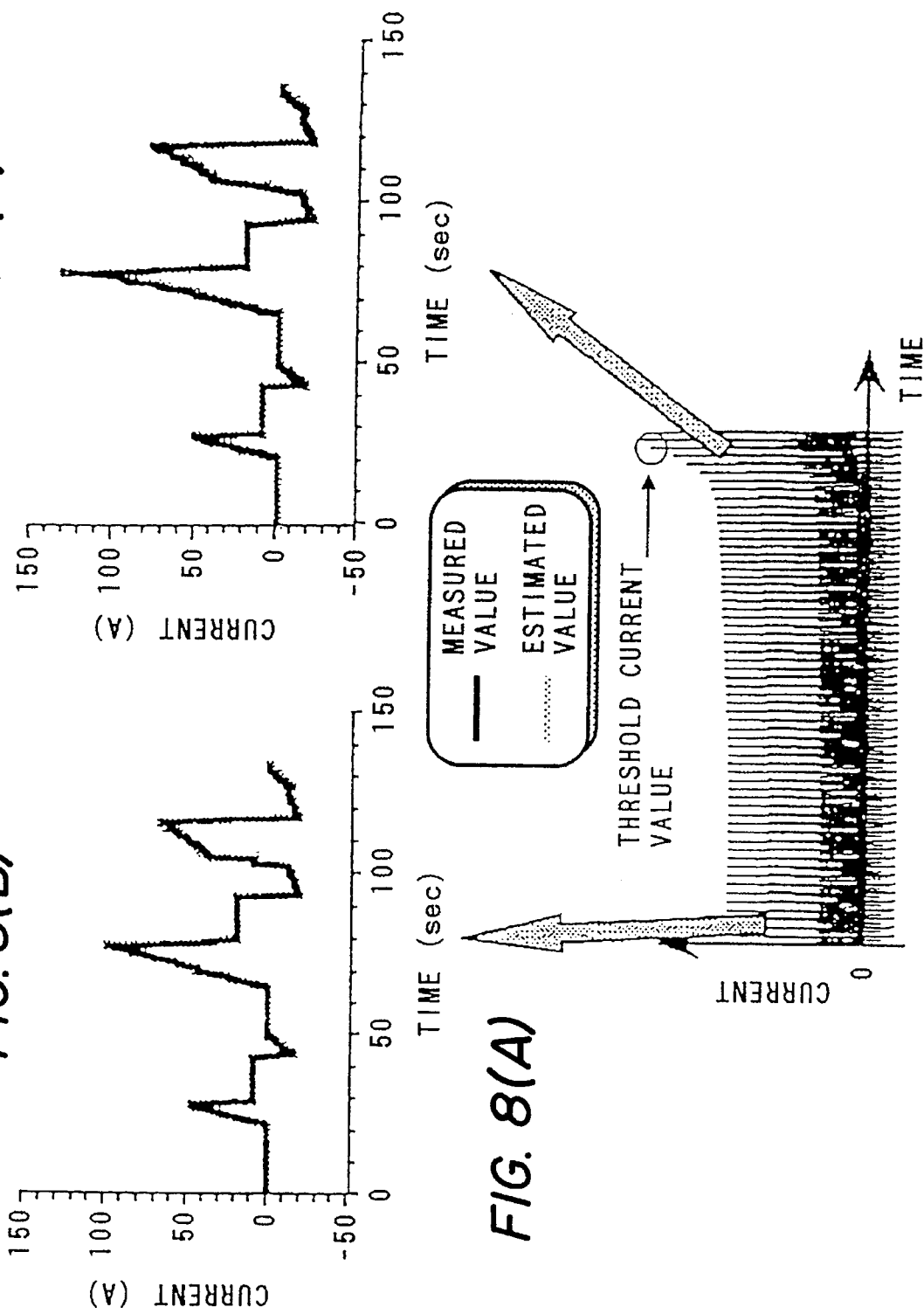
FIGS. 8A–8C are graphs showing current values measured in a battery charging/discharging experiment simulating the 10 mode drive and estimated current values estimated by the battery characteristic equation determined according to this invention.

FIGS. 8A–8C illustrate, there are shown a result of a battery charge-discharge experiment simulating the 10 mode drive and the estimated current values obtained according to the battery characteristic equation of this invention, superimposed on one another. It is ascertained from FIGS. 8A–8C that an accurate estimation of the current values is feasible over almost the entire area until the threshold current starts charging. Hence, an end of the discharge can be readily judged.

(Embodiment 2)

Figure 9:
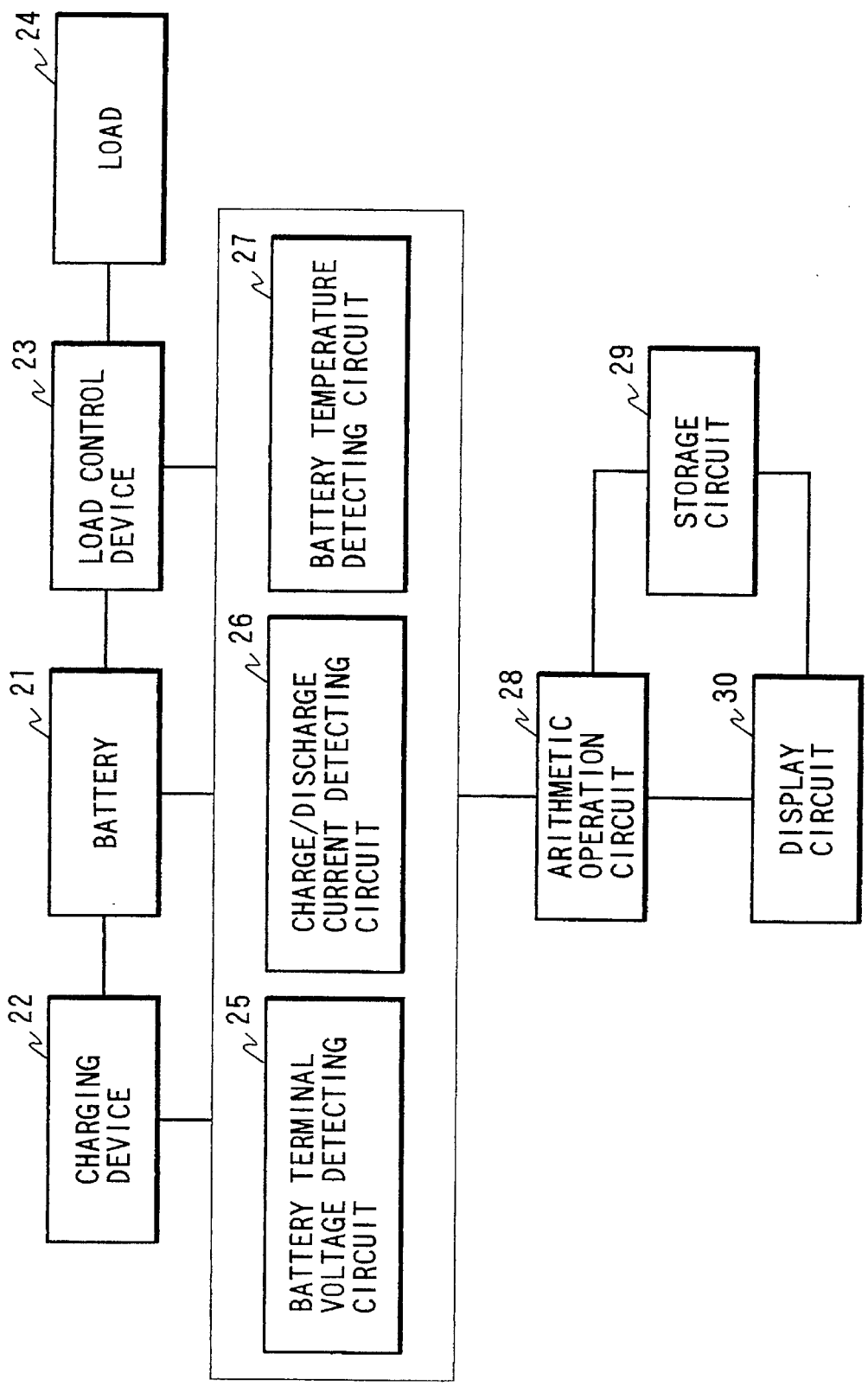
FIG. 9 is a block diagram of a battery state judging apparatus according to a second embodiment of this invention.

Referring to FIG. 9, there is shown a battery state judging apparatus according to a second embodiment of this invention. In FIG. 9, the battery state judging apparatus includes a battery 21 connected to a charging device 22 and an electric load 24 through a load control device 23. The battery state judging apparatus further includes a circuit 25 detecting a voltage at a battery terminal, a circuit 26 detecting a discharged current flowing from the battery 22 to the electric load 24 and/or a regenerative charged current from the electric load 24, and a circuit 27 detecting a temperature of the battery 21. The battery state judging apparatus further includes an arithmetic operation unit 28, a storage circuit 29 and a display circuit 30. Operation of these circuits will be described hereinafter. Incidentally, the arithmetic operation circuit 28 can be configured with a microcomputer or the like.

The storage circuit 29 stores the battery characteristic equation as an estimating equation. Equations (6) and (6') are fundamental forms of the battery characteristic equation. The storage circuit 29 also stores data of detected voltage and the like of the battery for a predetermined period.

$$Ir = Wat(A \cdot So^k + B \cdot So + C \cdot Wat + D) \quad (6)$$

$$Ir' = Wat(A' \cdot So^{k'} + B' \cdot So + C' \cdot Wat + D') \quad (6')$$

where:
Ir is an estimated discharged current;
A, B, C and D are coefficients;
Ir' is an estimated charged current;
A', B', C' and D' are coefficients; and
Wat is a power consumption (W) per one battery. In the case of a sealed lead storage battery, k=30 and k'=2.

The above So is given by equation (7), where So=0 when SOC>100.

$$So = 1 - SOC/100 \quad (7)$$

The above SOC represents a reduced residual capacity index (%) at 0.2 CA of the battery, given by a following equation (8) which is analogous to the equation (4) described before:

$$SOC = (Aho \cdot Kt - \Sigma i \cdot Kidt + \alpha)/Aho \times 100(\%) \quad (8)$$

where:
Aho is a reference capacity (a 5-hour rated capacity);
i is an output current including a charged current and a discharge current;
Kt is a temperature correction coefficient;
K is a current correction coefficient; and
α is a battery capacity recovery value during a charge/discharge downtime.

Figure 10:
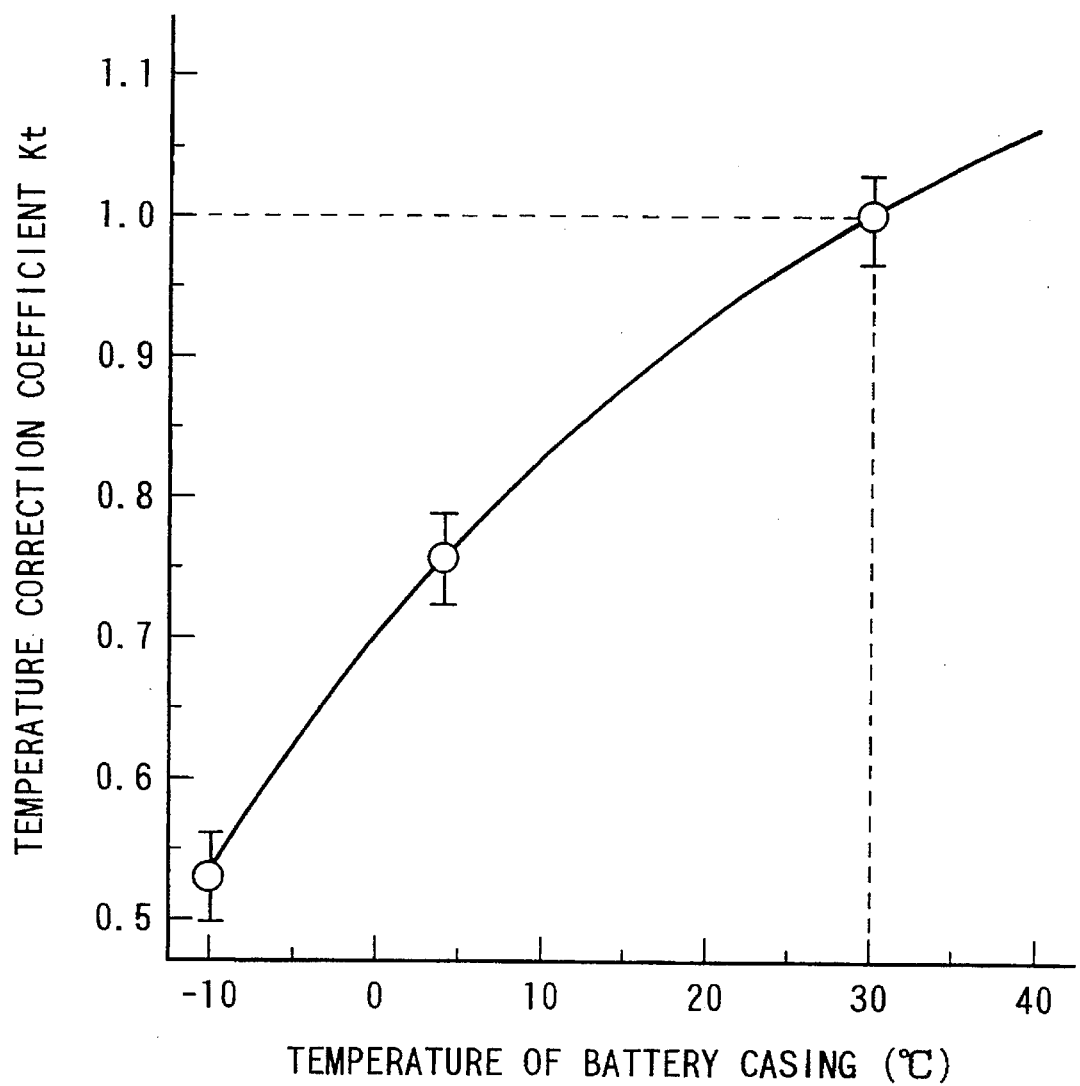
FIG. 10 is a graph showing a relation between temperatures of the battery casing and a temperature correction coefficient.
Figure 11:
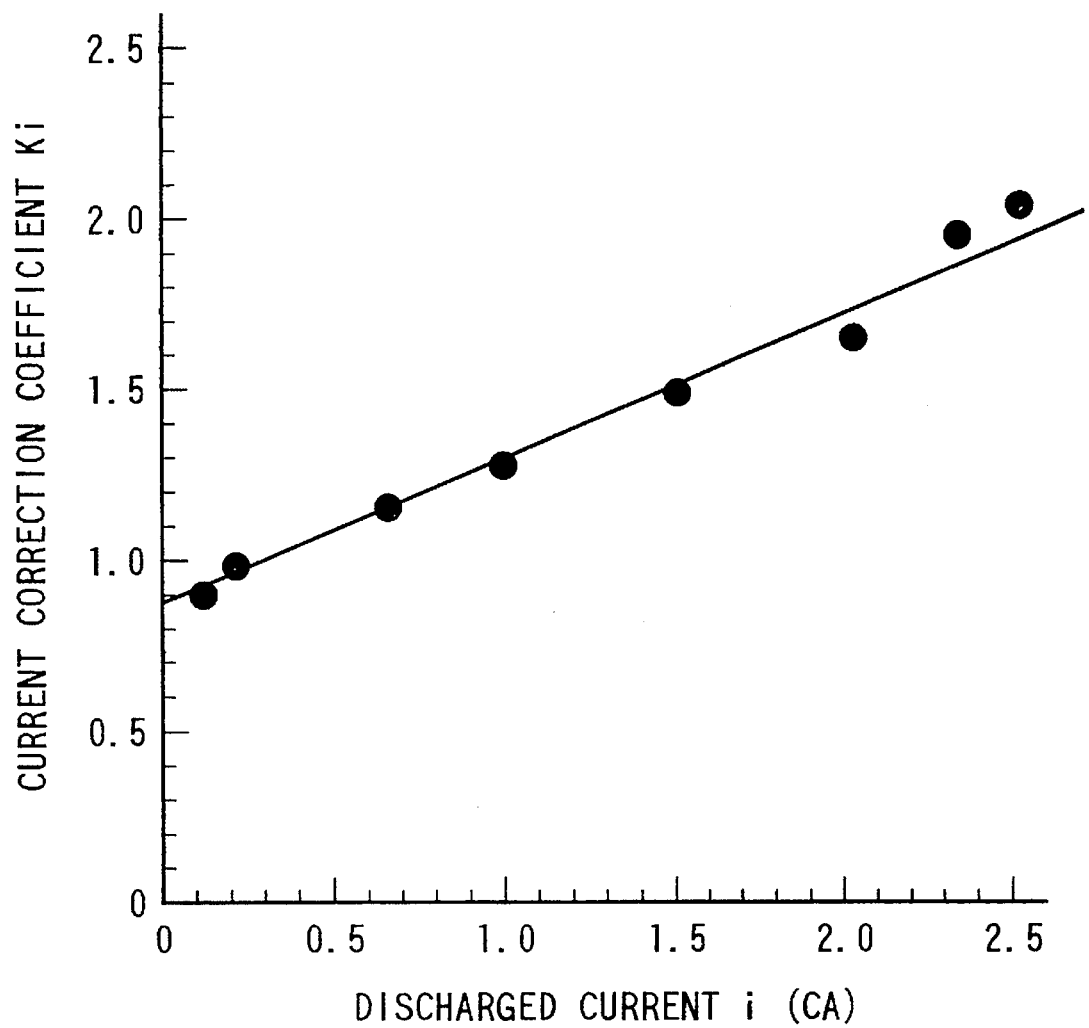
FIG. 11 is a graph showing a relation between a discharged current and a current correcting coefficient.

FIG. 10 shows a relationship between a temperature of a casing of the battery and the temperature correction coefficient Kt. FIG. 11 shows a relation between a discharged current and a current correction coefficient Ki.

The above battery capacity recovery value a is given by an equation:

$$\alpha = (\Sigma i \cdot Kidt - \Sigma idt) \times [t - \exp(-t/Tk)] \quad (9)$$

where:
t is a discharge downtime; and
Tk is a constant.

Figure 12:
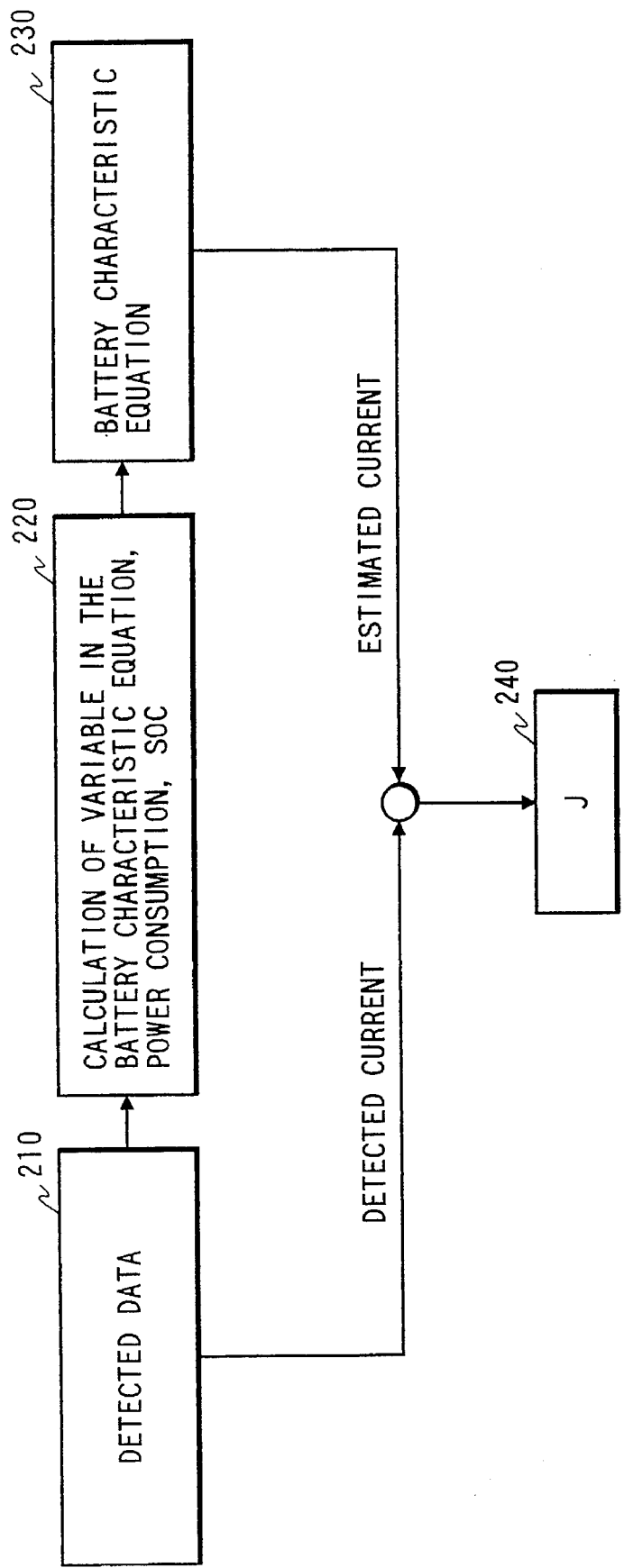
FIG. 12 is a flowchart showing a process carried out in an arithmetic operation circuit.

FIG. 12 shows how the coefficients in the characteristic equation are determined. In FIG. 12, data of 1 voltage at the battery terminal, charged and discharged currents, a temperature of the battery, etc. are detected in a constant current charge-discharge experiment, a constant power discharge experiment and the like (step 210). From these detected data, a power consumption War, a 0.2 CA reduced residual capacity index SOC are calculated (step 220). The obtained power consumption Wat and the 0.2 CA reduced residual capacity index SOC are substituted in the battery characteristic equation [equations (6) and (6')] to obtain an estimated discharged current Ir and an estimated charged current Ir' (step 230). By comparing the estimated discharged current Ir and the estimated charged current Ir' with an actually detect current Id, optimum coefficients A, B, C, D, A' , B' C' , and D' are so calculated that a root mean-square error J in an equation (10) becomes a minimum (Step 240):

$$J = \sqrt{\Sigma(Ir-Id)^2/\Sigma Id^2} \quad (10)$$

Figure 13:
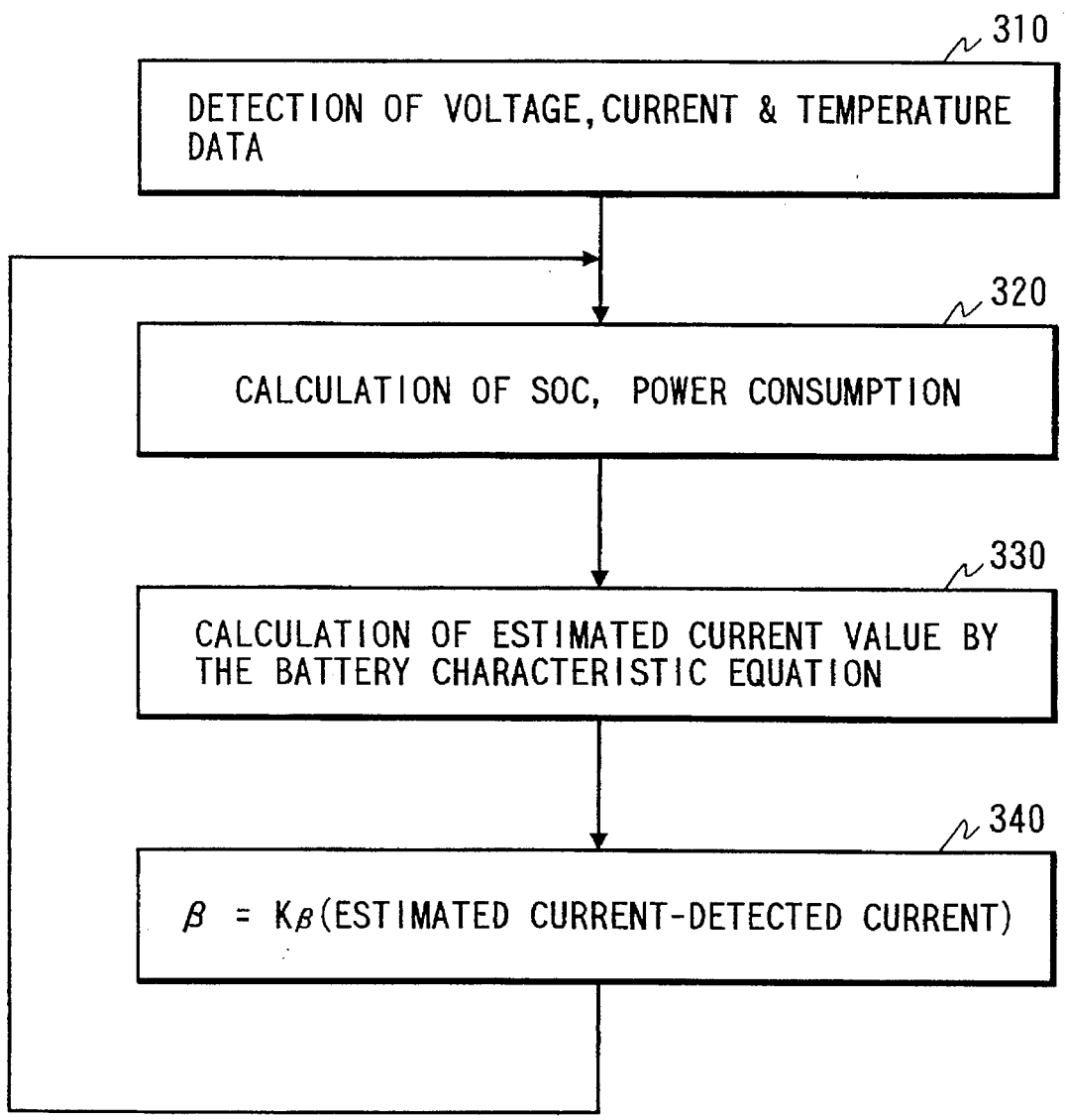
FIG. 13 is a flowchart showing a process carried out in the arithmetic operation circuit.

The arithmetic operation circuit 28 calculates a correction quantity R to correct the 0.2 CA reduced residual capacity index SOC according to a procedure shown in FIG. 13. At step 310, data of a voltage at the battery terminal, a discharged current, a temperature of the battery, etc. are detected. At step 320, an SOC and a power consumption Wat are calculated. The SOC and power consumption Wat are substituted in the battery characteristic equation (6) to obtain an estimated discharged current Ir (step 330). A difference between the estimated discharged current and the detected current Id (Ir–Id) is multiplied by a correction attenuation coefficient KS to determine the above correction quantity n (step 340)

The correction quantity $\beta$ is fed back to equation (8) for SOC to correct a value of the SOC by the following equation:

$$SOC = (Aho \cdot Kt - \Sigma i \cdot Ki dt + \alpha + \beta)/Aho) \times 100(\%) \quad (11)$$

The above correction is effective to determine an accurate SOC in the current use and to improve an accuracy in estimation of a battery usable capacity.

It is obvious from equation (11) that accurate values of the temperature correction coefficient Kt and the current correction coefficient Ki become unnecessary by virtue of the above correction. It is thus possible to accurately calculate the SOC even if the battery characteristic changes.

The display circuit 30 shown in FIG. 9 calculates an estimated discharged current Ir from the equation (6) or an estimated charged current Ir from the equation (6') on the basis of a predetermined operation pattern (for example, a power consumption per at sec. in the 10 mode drive) stored in advance in the storage circuit 29 and the SOC calculated from the detected data. At the same time, the display circuit 30 estimates a voltage at the battery terminal by dividing the power consumption Wat at that time by the estimated discharged current Ir or the estimated charged current Ir', then calculates a corrected SOC by using the estimated discharged current Ir or the estimated charged current Ir' as a discharged current I in the equation (11).

By repeating the above calculation, the SOC and the estimated discharged current are successively calculated to determine a time when the estimated voltage at the battery terminal falls below a predetermined voltage (a discharge end voltage) set in advance for each discharge current. Here, the discharge end voltage means a discharge stop voltage where further discharge should be avoided to reduce the need to perform maintenance on the electrode plates of the battery. The above time represents a battery usable period if the battery is continuously used in a predetermined pattern.

Figure 14:
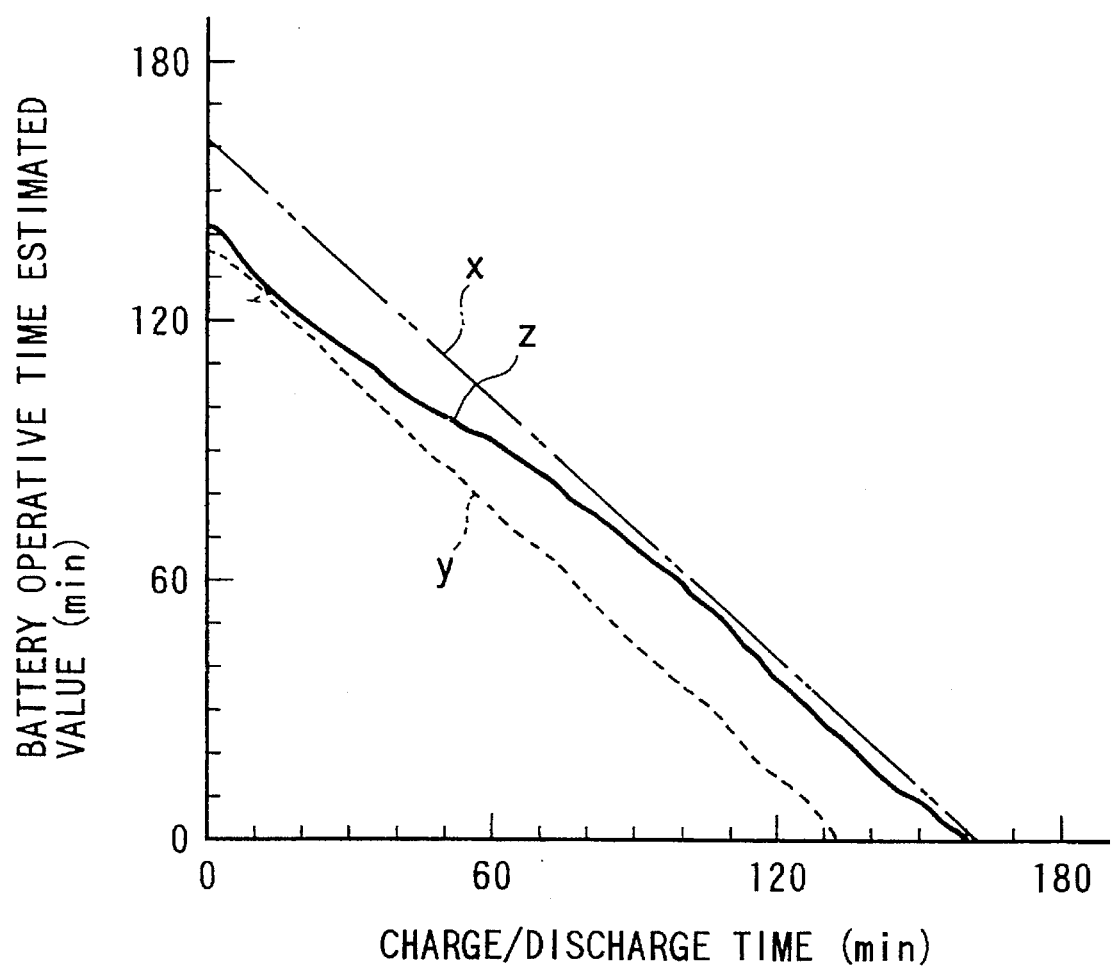
FIG. 14 is a graph showing an effect of the battery state judging apparatus according to this invention.

FIG. 14 shows an effect of this embodiment. A line x in FIG. 14 represents an actual battery operable period in the case where a battery charging experiment is conducted employing a power value of simulating the 10 mode drive as a command value. A line y is obtained by calculating an operable period without correcting the SOC. The line y shows a tendency to extend along the line x of the actual operable period. It can, however, be seen from the line y that constant errors always occur if there are variations in the battery reference capacity. To the contrary, correction of the SOC allows the line y to gradually conform with the actual operable period with good accuracy as the successive calculation proceeds even if there are variations in the reference capacity, as shown by a line z.

It is possible in this embodiment to calculate a battery operable period on an assumption that not the predetermined operation pattern but an operation pattern within a certain past period continues from now on.

In this embodiment, the time when the discharge end voltage falls below the predetermined voltage is detected. It is also effective to detect a time when the battery discharged current exceeds a predetermined threshold current.

It is, of course, possible to employ another evaluation function instead of the root-mean-square error J in the equation (10). The coefficient correction for the battery characteristic equation by the evaluation function is not particularly required if estimation of the operable period is sufficiently accurate.

It is also possible to judge a battery residual capacity with a value of the battery residual capacity index SOC instead of calculating an operable period.

Instead of calculating an operable period, it is possible to judge a threshold of operation of the battery when a value obtained by adding a correction quantity $\beta$ to the battery reference capacity value Aho (Sho+$\beta$) falls below, for example, 80% of the Aho.

If the accuracy in estimation of the operable period is sufficiently high, it is not particularly necessary to provide corrections for the temperature correction coefficient Kt, the current correction coefficient Ki, the battery capacity recovery value a during a downtime of charge/discharge, etc.

(Embodiment 3)

Figure 15:
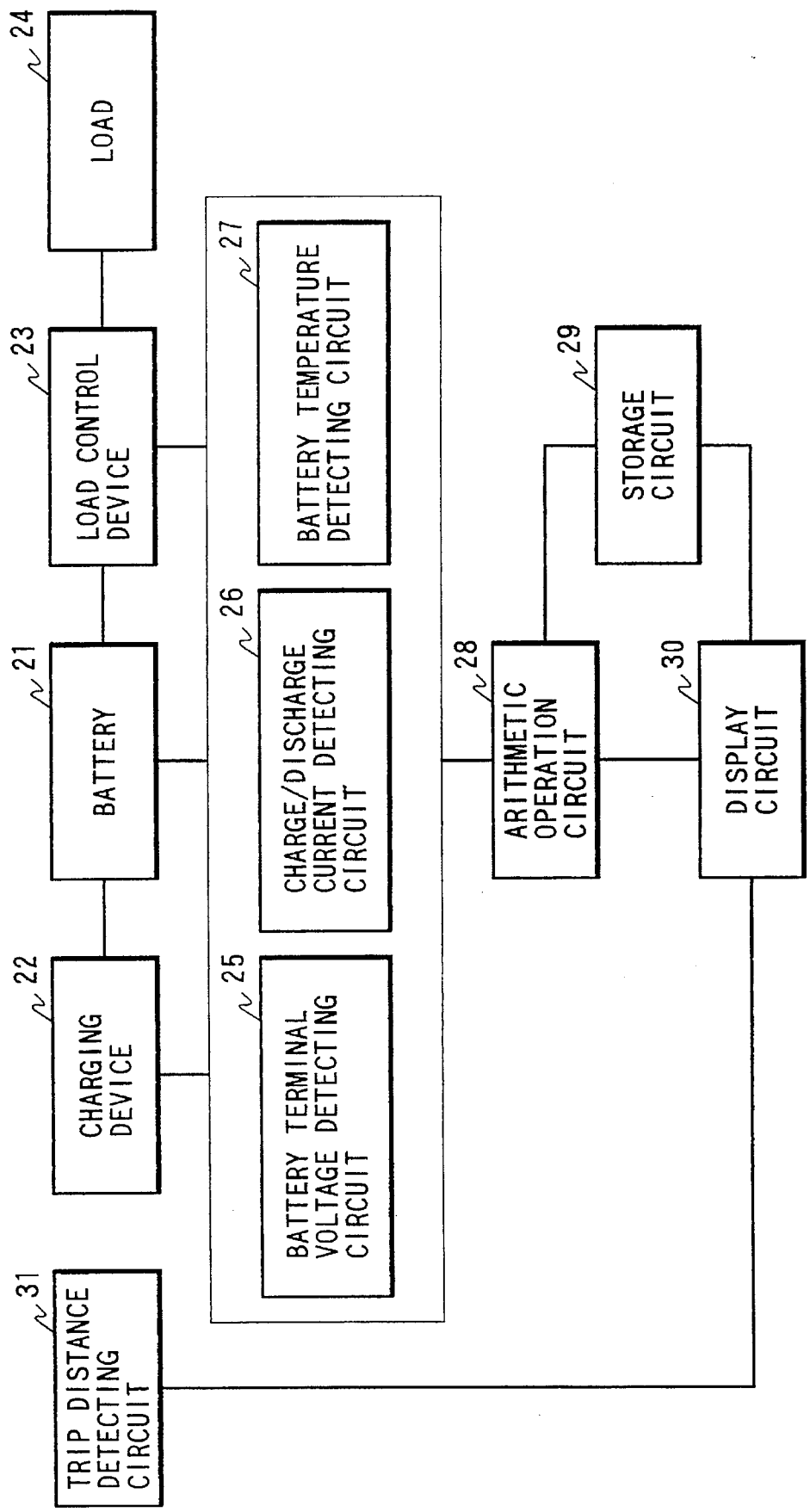
FIG. 15 is a battery state judging apparatus according to a third embodiment of this invention.

FIG. 15 shows a battery state judging apparatus according to a third embodiment of this invention. The battery state judging apparatus shown in FIG. 15 is provided with a trip distance detecting circuit 31 in addition to the elements of the battery state judging apparatus according to the second embodiment. The trip distance detecting circuit 31 makes it possible to calculate a mean trip distance within a certain past time period going back from the present time. The display circuit 30 displays an available distance for which the vehicle will be able to run within the above operable period of the battery if the vehicle continuously runs in the same driving pattern.

(Embodiment 4)

FIG. 16 shows a battery state judging apparatus according to a fourth embodiment of this invention. The battery state judging apparatus shown in FIG. 15 includes a detected data storing circuit 32 and an optimization circuit 33 in addition to the elements included in the apparatus according to the second embodiment. The optimization circuit 33 reforms the battery characteristic equations (6) and (6') after a trip by the vehicle on the basis of detected data of a voltage at the battery terminal and the like stored in the storage circuit 32 during the trip of the vehicle, in the similar manner described in connection with FIG. 12.

The above operation of the optimization circuit 33 allows the battery characteristic equations to be updated so that they reflect the latest battery characteristics, thereby reducing a burden on the correction quantity S in the equation (11), permitting an estimated value of the battery operable period to be in conformity with a value of an actual battery operable period within a short period.

What is claimed is:

1. A battery state judging apparatus comprising:
   a current detecting means for detecting a charge/discharge current of a battery;
   a charge/discharge electric quantity detecting means for adding a current correction coefficient corresponding to the charge/discharge current detected by said current detecting means to said charge/discharge current to detect a charge/discharge electric quantity;
   a battery residual capacity calculating means for calculating a battery residual capacity from a reference capacity value and said charge/discharge electric quantity of said battery;
   a consumed power detecting means for detecting a consumed power of said battery;
   a charge/discharge current estimating means for estimating a charge/discharge current of said battery from said battery residual capacity and said battery consumed power; and
   a correcting means for correcting said battery residual capacity on the basis of a correction quantity corresponding to a difference between said estimated charge/discharge current detected by said charge/discharge current estimating means and said charge/discharge current detected by said current detecting means.

2. A battery state judging apparatus according to claim 1, further comprising:
   a temperature detecting means for detecting a temperature of said battery; and
   a second correcting means for correcting said reference capacity value obtained by said battery residual capacity calculating means based on said temperature of said battery detected by said temperature detecting means.

3. A battery state judging apparatus according to claim 1, further comprising:
   a charge/discharge downtime correcting means for correcting said battery residual capacity calculated by said battery residual capacity calculating means based on a battery recovery value of said battery in a state of charge/discharge downtime.

4. A battery state judging apparatus according to claim 1, further comprising:
   a data storage means for storing data of said battery charge/discharge current, a temperature of said battery detected by a temperature sensing unit and a voltage of said battery detected by a voltage sensing unit; and
   an optimization means for optimizing an estimation equation used in said charge/discharge current estimating means to obtain said estimated charge/discharge current based on said data stored in said data storage means after a trip of a vehicle having said battery state judging apparatus.

5. A battery state judging apparatus according to claim 1, wherein a function used in said charge/discharge current estimating means to obtain said estimated charge/discharge current is represented by:

$$(\text{charge/discharge current}) = (\text{power consumption}) \times (A \times (\text{residual capacity index})^{K2} + B \times (\text{residual capacity index})^{K2} + C \times (\text{power consumption})^{K3} + D$$

where A, B, C and D are coefficients; and

K1, K12 and K13 are constants.

6. A battery state judging apparatus according to claim 5, wherein said coefficients A, B, C and D are determined so as to one of minimize and maximize an evaluation function with respect to a different said estimated charge/discharge current and said charge/discharge current.

* * * * *